(12) United States Patent
Yang et al.

(10) Patent No.: US 12,725,663 B2
(45) Date of Patent: Sep. 1, 2026

(54) SEMICONDUCTOR MEMORY DEVICE PERFORMING PROGRAM OPERATION

(71) Applicant: SK hynix Inc., Icheon-si (KR)

(72) Inventors: In Gon Yang, Icheon-si (KR); Jae Hyeon Shin, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 166 days.

(21) Appl. No.: 18/505,933

(22) Filed: Nov. 9, 2023

(65) Prior Publication Data

US 2024/0420781 A1 Dec. 19, 2024

(30) Foreign Application Priority Data

Jun. 14, 2023 (KR) ........................ 10-2023-0076157

(51) Int. Cl.
*G11C 16/34* (2006.01)
*G11C 16/24* (2006.01)

(52) U.S. Cl.
CPC .......... *G11C 16/3459* (2013.01); *G11C 16/24* (2013.01); *G11C 16/3404* (2013.01)

(58) Field of Classification Search
CPC .. G11C 16/3459; G11C 16/24; G11C 16/3404
USPC ..................................................... 365/185.22
See application file for complete search history.

(56) References Cited

U.S. PATENT DOCUMENTS 10,629,277 B2 * 4/2020 Chai ...................... G11C 16/26
2009/0141561 A1 * 6/2009 Yang .................. G11C 11/5628 365/189.05
2010/0080059 A1 * 4/2010 Chen .................. G11C 16/0483 365/185.12

(Continued)

FOREIGN PATENT DOCUMENTS

| | | | |
|---|---|---|---|
| KR | 101063571 | B1 | 9/2011 |
| KR | 101642015 | B1 | 7/2016 |
| KR | 1020220159844 | A | 12/2022 |

OTHER PUBLICATIONS

B. Kim et al., "28.2 A High-Performance 1Tb 3b/Cell 3D-NAND Flash with a 194MB/s Write Throughput on over 300 Layers," 2023 IEEE International Solid-State Circuits Conference (ISSCC), San Francisco, CA, USA, 2023, pp. 27-29, doi: 10.1109/ISSCC42615.2023.10067666. (Year: 2023).*

(Continued)

*Primary Examiner* — Alexander Sofocleous
*Assistant Examiner* — Duy H Luong
(74) *Attorney, Agent, or Firm* — WILLIAM PARK AND ASSOCIATES LTD.

(57) ABSTRACT

A page buffer of a semiconductor memory device includes a bit line connection transistor, an internal operation circuit, and a plurality of latch circuits. During a program operation of selected memory cells, a power voltage is applied to the bit line connection transistor to set a voltage of a bit line connected to memory cells having a threshold voltage greater than a main verify voltage as a program inhibit voltage. In addition, a second program allowable voltage less than the program inhibit voltage is applied to the bit line connection transistor. In addition, a first program allowable voltage less than the second program allowable voltage is applied to the gate of the bit line connection transistor.

17 Claims, 13 Drawing Sheets

(56) References Cited

U.S. PATENT DOCUMENTS

| | | | | |
|---|---|---|---|---|
| 2014/0126285 | A1* | 5/2014 | Kang | G11C 11/5642 365/185.18 |
| 2019/0189215 | A1* | 6/2019 | Yang | G11C 16/3459 |
| 2022/0270697 | A1* | 8/2022 | Hwang | G11C 16/3459 |
| 2022/0383968 | A1* | 12/2022 | Lee | G11C 16/3459 |
| 2023/0062706 | A1* | 3/2023 | Mun | G11C 16/32 |

OTHER PUBLICATIONS

B. Kim et al., "28.2 A High-Performance 1Tb 3b/Cell 3D-NAND Flash with a 194MB/s Write Throughput on over 300 Layers," 2023 IEEE International Solid-State Circuits Conference (ISSCC), 2023, Presentation Slides (27 pages).*

* cited by examiner

Figure 1:
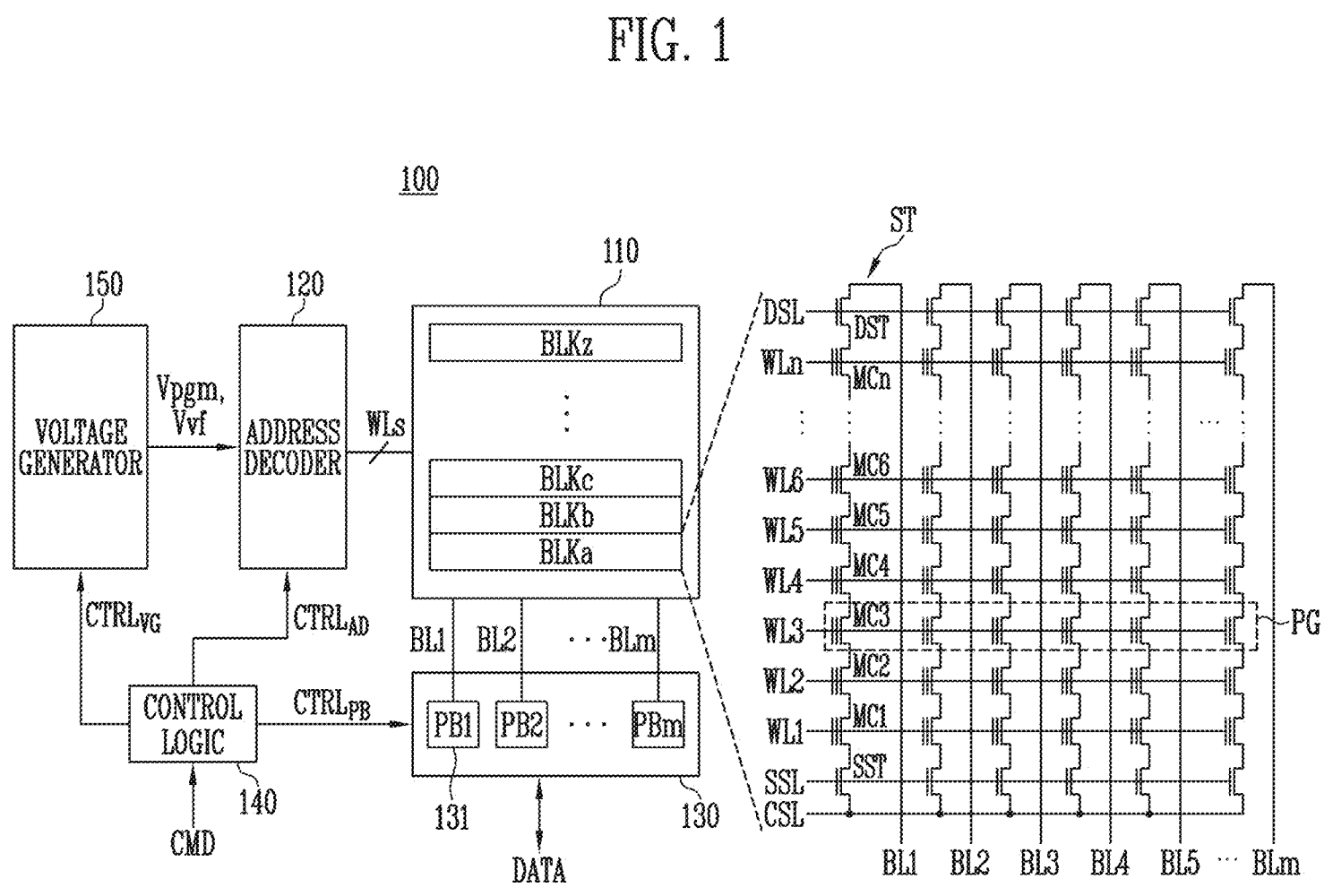

110 BLKz BLKc BLKb BLKa

120 ADDRESS DECODER

130 PB1 PB2 PBm 131

140 CONTROL LOGIC

150 VOLTAGE GENERATOR

Vpgm, Vvf WLs BL1 BL2 BLm $CTRL_{AD}$ $CTRL_{PB}$ $CTRL_{VG}$ CMD DATA

ST PG DSL WLn WL6 WL5 WL4 WL3 WL2 WL1 SSL CSL DST MCn MC6 MC5 MC4 MC3 MC2 MC1 SST BL1 BL2 BL3 BL4 BL5 BLm

| | |
|---|---|
| $BL_A$ | VSS |
| $BL_B$ | VREF1 |
| $BL_C$ | VREF2 |
| $BL_D$ | Vinh |

BL1
PB_SENSE
N1
201
CSO
INTERNAL OPERATION CIRCUIT
205
SO
LAT1
210
LAT2
220
LAT3
230
LAT4
240
LAT5
250

FIG. 11

SEMICONDUCTOR MEMORY DEVICE PERFORMING PROGRAM OPERATION

CROSS-REFERENCE TO RELATED APPLICATION

The present application claims priority under 35 U.S.C. § 119(a) to Korean patent application number 10-2023-0076157 filed on Jun. 14, 2023, in the Korean Intellectual Property Office, the entire disclosure of which is incorporated by reference herein.

BACKGROUND

1. Technical Field

The present disclosure relates to an electronic device, and more particularly, to a semiconductor memory device performing a program operation.

2. Related Art

A semiconductor memory device may be formed in a two-dimensional structure in which a string is horizontally arranged on a semiconductor substrate or a three-dimensional structure in which a string is vertically stacked on a semiconductor substrate. The three-dimensional memory device is a memory device designed to resolve an integration degree limit of the two-dimensional memory device, and may include a plurality of memory cells stacked in a vertical direction on the semiconductor substrate.

During a program operation of a selected memory cell, a plurality of program loops on the selected memory cells are performed. Each of the program loops may include a first auxiliary verify operation, a second auxiliary verify operation, and a main verify operation. The first auxiliary verify operation includes an operation of sensing a threshold voltage of memory cells using a first auxiliary verify voltage less than a main verify voltage used in the main verify operation. The second auxiliary verify operation includes an operation of sensing the threshold voltage of the memory cells using a second auxiliary verify voltage less than the first auxiliary verify voltage used in the first auxiliary verify operation. A threshold voltage distribution characteristic of memory cells formed by a program operation may be improved by differently controlling a bit line voltage of memory cells having threshold voltages corresponding to each of sections divided by the first and second auxiliary verify voltages and the main verify voltages.

SUMMARY

According to an embodiment of the present disclosure, a semiconductor memory device includes a memory cell array, a plurality of page buffers, and control logic. The memory cell array includes a plurality of memory cells. The plurality of page buffers are respectively connected to the plurality of memory cells through bit lines. The control logic controls a program operation of each of the plurality of page buffers. Each of the plurality of page buffers includes a bit line connection transistor, an internal operation circuit, and a plurality of latch circuits. The bit line connection transistor is connected to a corresponding bit line. The internal operation circuit is connected to the bit line connection transistor through a first node. The plurality of latch circuits are connected to the internal operation circuit through a second node. During a program operation of selected memory cells among the plurality of memory cells, the control logic controls the plurality of page buffers to set a voltage of a bit line connected to memory cells having a threshold voltage greater than a main verify voltage corresponding to a target program state among the plurality of memory cells to a program inhibit voltage by applying a power voltage to a gate of the bit line connection transistor included in each of the plurality of page buffers, controls the plurality of page buffers to set a voltage of a bit line connected to memory cells having a threshold voltage greater than a first auxiliary verify voltage corresponding to the target program state and less than the main verify voltage among the plurality of memory cells to a second program allowable voltage less than the program inhibit voltage by applying the second program allowable voltage to the gate of the bit line connection transistor included in each of the plurality of page buffers, and controls the plurality of page buffers to set a voltage of a bit line connected to memory cells having a threshold voltage greater than a second auxiliary verify voltage corresponding to the target program state and less than the first auxiliary verify voltage among the plurality of memory cells to the second program allowable voltage by applying a first program allowable voltage less than the second program allowable voltage to the gate of the bit line connection transistor included in each of the plurality of page buffers.

According to another embodiment of the present disclosure, a semiconductor memory device includes a memory cell, a page buffer, and control logic. The memory cell stores N bits. Here, N is a natural number greater than or equal to 2. In addition, the page buffer is connected to the memory cell through a bit line. The control logic controls a program operation of the page buffer. The page buffer includes a bit line connection transistor, an internal operation circuit, and a plurality of latch circuits. The bit line connection transistor is connected to the bit line. The internal operation circuit is connected to the bit line connection transistor through a first node. The plurality of latch circuits are connected to the internal operation circuit through a second node. The memory cell is programmed to a target program state among first to (2N−1)-th program states. During a program operation of the memory cell, the control logic controls the page buffer to perform verify operations using a main verify voltage, a first auxiliary verify voltage, and a second auxiliary verify voltage corresponding to the target program state, respectively. After the verify operations on the memory cell, the control logic controls the page buffer to set a voltage of the bit line according to a threshold voltage of the memory cell by sequentially applying a power voltage, a second program allowable voltage, and a first program allowable voltage to a gate of the bit line connection transistor.

BRIEF DESCRIPTION OF THE DRAWINGS

FIG. 1 is a block diagram illustrating a semiconductor memory device according to an embodiment of the present disclosure.

FIG. 5 is a block diagram illustrating a page buffer according to an embodiment of the present disclosure.

FIG. 11 is an example circuit diagram of a fifth latch circuit shown in FIG. 5.

DETAILED DESCRIPTION

Figure 2:
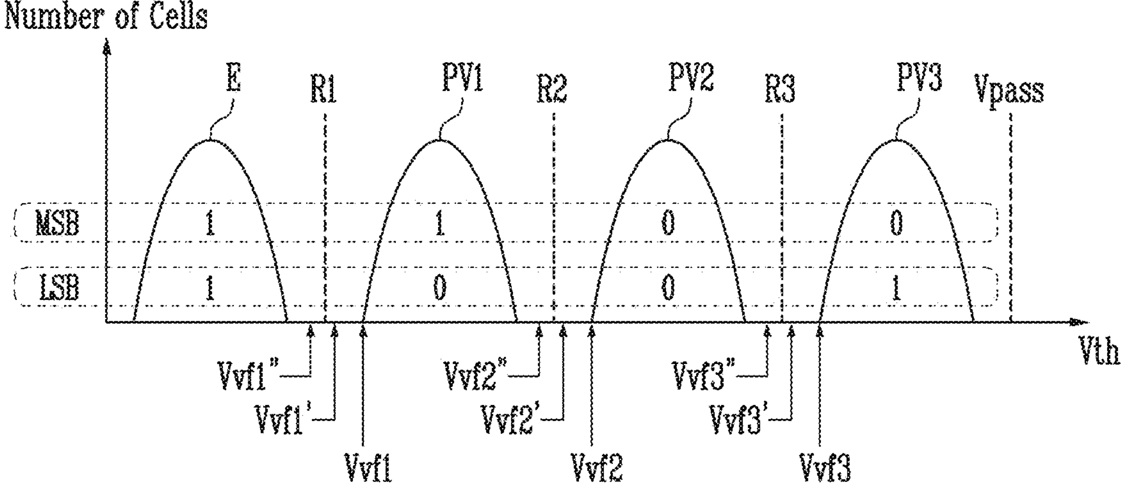
FIG. 2 is a diagram illustrating a threshold voltage distribution of a multi-level cell (MLC), and a main verify voltage, a first auxiliary verify voltage, and a second auxiliary verify voltage for forming the threshold voltage distribution.

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure may be directed to a semiconductor memory device setting bit line voltages to perform first and second auxiliary verify operations and a main verify operation. The present technology may be directed to a semiconductor memory device setting bit line voltages to perform first and second auxiliary verify operations and a main verify operation.

FIG. 1 is a block diagram illustrating a semiconductor memory device according to an embodiment of the present disclosure.

Referring to FIG. 1, the semiconductor memory device 100 includes a memory cell array 110, an address decoder 120, a read and write circuit 130, control logic 140, and a voltage generator 150.

The memory cell array 110 includes a plurality of memory blocks BLKa to BLKz. The plurality of memory blocks BLKa to BLKz are connected to the address decoder 120 through word lines WLs. The plurality of memory blocks BLKa to BLKz are connected to the read and write circuit 130 through bit lines BL1 to BLm. Each of the plurality of memory blocks BLKa to BLKz includes a plurality of memory cells. As an embodiment, the plurality of memory cells may be configured as nonvolatile memory cells.

FIG. 1 shows a structure of a memory block BLKa among the plurality of memory blocks BLKa to BLKz included in the memory cell array. Referring to FIG. 1, the plurality of word lines WL1 to WLn arranged in parallel with each other may be connected between a drain select line DSL and a source select line SSL. More specifically, the memory block BLKa may include a plurality of strings ST connected between the bit lines BL1 to BLm and a common source line CSL. The bit lines BL1 to BLm may be connected to the corresponding strings ST, respectively, and the common source line CSL may be commonly connected to the strings ST. Because the strings ST may be configured identically to each other, the string ST connected to the first bit line BL1 is specifically described as an example.

The string ST may include a source select transistor SST, a plurality of memory cells MC1 to MCn, and a drain select transistor DST connected in series between a source line SL and the first bit line BL1. One string ST may include at least one source select transistor SST and at least one drain select transistor DST.

A source of the source select transistor SST may be connected to a common source line CSL and a drain of the drain select transistor DST may be connected to the first bit line BL1. The memory cells MC1 to MCn may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MCn may be connected to the plurality of word lines WL1 to WLn. A group of the memory cells connected to the same word line among the memory cells included in different strings ST may be referred to as a physical page PG. Therefore, a memory block BLKi may include the pages PG of the number of the word lines WL1 to WLn.

One memory cell may store one bit of data. This is commonly referred to as a single level cell (SLC). In this case, one physical page PG may store one logical page (LPG) data. The one logical page (LPG) data may include data bits of the same number as cells included in one physical page PG.

Meanwhile, one memory cell may store two or more bits of data. In this case, one physical page PG may store two or more logical page (LPG) data.

In FIG. 1, a structure of a two-dimensional memory block is shown, but the present disclosure is not limited thereto. That is, each of the memory blocks BLKa to BLKz of FIG. 1 may be configured as a three-dimensional memory block.

The address decoder 120, the read and write circuit 130, and the voltage generator 150 operate as a peripheral circuit that drives the memory cell array 110. The peripheral circuit may perform a read operation, a write operation, and an erase operation on the memory cell array 110, based on control of the control logic 140. The address decoder 120 is connected to the memory cell array 110 through the word lines WLs. The address decoder 120 is configured to operate in response to the control of the control logic 140. Specifically, the control logic 140 transfers an address decoding control signal $CTRL_{AD}$ to the address decoder 120, and the address decoder 120 performs a decoding operation based on the address decoding control signal $CTRL_{AD}$.

In addition, during the program operation, the address decoder 120 applies a program voltage VPGM generated by the voltage generator 150 to a selected word line and applies a program pass voltage to remaining unselected word lines. In addition, during a program verify operation, the address decoder 120 applies a verify voltage Vvf generated by the voltage generator 150 to the selected word line and applies a verify pass voltage to the remaining unselected word lines.

The read and write circuit 130 includes a plurality of page buffers PB1 to PBm. The read and write circuit 130 may operate as a "read circuit" during the read operation of the memory cell array 110 and may operate as a "write circuit" during a write operation of the memory cell array 110. The plurality of page buffers PB1 to PBm are connected to the memory cell array 110 through the bit lines BL1 to BLm. The read and write circuit 130 performs the program operation on received data DATA in response to a page buffer control signal $CTRL_{PB}$ output from the control logic 140. An embodiment of the page buffer 131 among the plurality of page buffers PB1 to PBm is described with reference to FIG. 5.

The control logic 140 is connected to the address decoder 120, the read and write circuit 130, and the voltage generator 150. The control logic 140 may receive a command CMD from an outside. The control logic 140 may control the address decoder 120, the read and write circuit 130, and the voltage generator 150 to perform an operation corresponding to the received command CMD. That is, the control logic 140 may control an operation of the voltage generator 150 through a voltage generation control signal $CTRL_{VG}$. In addition, the control logic 140 may control an operation of the address decoder 120 through the address decoding control signal $CTRL_{AD}$. Meanwhile, the control logic 140 may control an operation of the page buffers PB1 to PBm in the read and write circuit 130 through the page buffer control signal $CTRL_{PB}$. The control logic 140 may be implemented as hardware, software, or a combination of hardware and software. For example, the control logic 140 may be a control logic circuit operating in accordance with an algorithm and/or a processor executing control logic code.

The voltage generator 150 may generate various operation voltages in response to the voltage generation control signal $CTRL_{VG}$ output from the control logic 140. For example, the voltage generator 150 may generate the program voltage VPGM used for the program operation and the verify voltage Vvf used for the program verify operation. In addition, the voltage generator 150 may generate the program pass voltage and the verify pass voltage.

FIG. 2 is a diagram illustrating a threshold voltage distribution of a multi-level cell (MLC), and a main verify voltage, a first auxiliary verify voltage, and a second auxiliary verify voltage for forming the threshold voltage distribution.

Referring to FIG. 2, a threshold voltage distribution of target states corresponding to the MLC is shown as an example. The MLC stores two bits of data including a most significant bit (MSB) and a least significant bit (LSB). In an example of FIG. 2, a memory cell corresponding to an erase state E may store a data pattern of "1 1", a memory cell corresponding to a first program state PV1 may store a data pattern of "1 0", a memory cell corresponding to a second program state PV2 may store a data pattern of "0 0", and a memory cell corresponding to a third program state PV3 may store a data pattern of "0 1". To read data of the MLC, first to third read voltages R1 to R3 may be used.

To store two bits of data respectively, the MLC may have a threshold voltage corresponding to any one of the erase state E and the first to third program states PV1 to PV3 after programing. To read data of the MLC, the first to third read voltages R1 to R3 may be used. Meanwhile, a pass voltage Vpass may be applied to an unselected word line.

During the program verify operation, main verify voltages Vvf1, Vvf2, and Vvf3, first auxiliary verify voltages Vvf1', Vvf2', and Vvf3', and second auxiliary verify voltages Vvf1", Vvf2", and Vvf3" may be used. The respective first auxiliary verify voltages Vvf1', Vvf2', and Vvf3' are less than the corresponding main verify voltages Vvf1, Vvf2, and Vvf3, and the respective second auxiliary verify voltages Vvf1", Vvf2", and Vvf3" are less than the corresponding first auxiliary verify voltages Vvf1', Vvf2', and Vvf3'.

A program method using the main verify voltages Vvf1, Vvf2, and Vvf3, the first auxiliary verify voltages Vvf1', Vvf2', and Vvf3', and the second auxiliary verify voltages Vvf1", Vvf2", and Vvf3" is described with reference to FIG. 3.

Figures 3, 4:
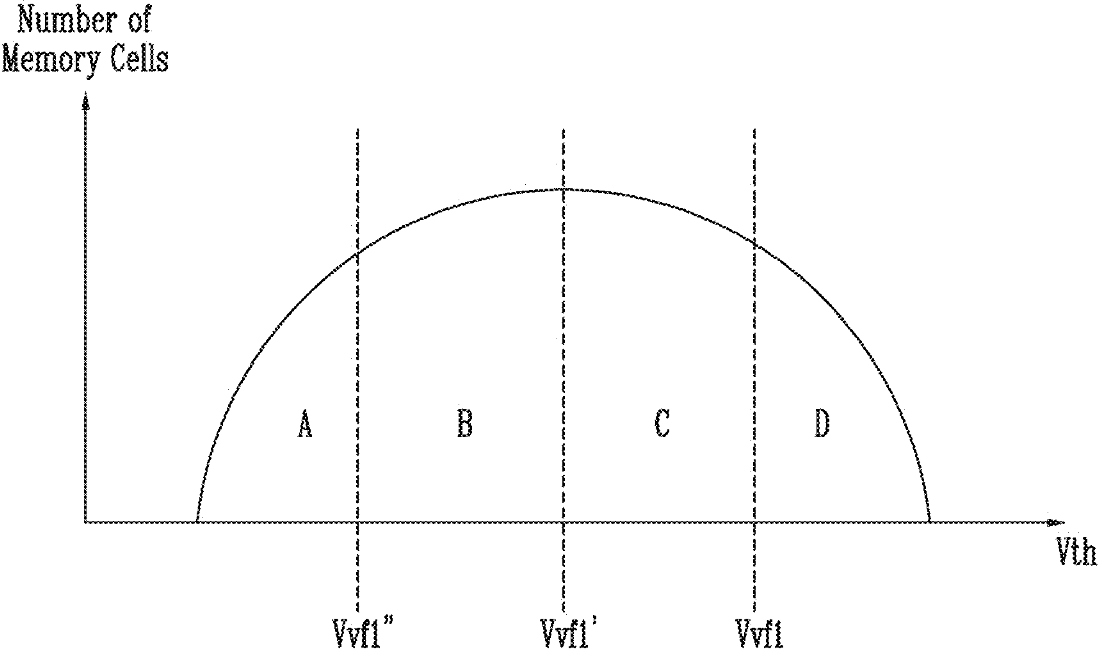
FIG. 3 is a diagram illustrating a main verify voltage, a first auxiliary verify voltage, and a second auxiliary verify voltage corresponding to a first program state, and sections a threshold voltage of memory cells distinguished by the main verify voltage, the first auxiliary verify voltage, and the second auxiliary verify voltage.
FIG. 4 is a table illustrating a bit line voltage setting of memory cells corresponding to sections shown in FIG. 3.

FIG. 3 is a diagram illustrating the main verify voltage, the first auxiliary verify voltage, and the second auxiliary verify voltage corresponding to the first program state PV1, and sections of a threshold voltage of memory cells distinguished by the main verify voltage, the first auxiliary verify voltage, and the second auxiliary verify voltage. FIG. 4 is a table illustrating a bit line voltage setting of memory cells corresponding to sections shown in FIG. 3. Hereinafter, control of a voltage of a bit line connected to memory cells to be programmed to the first program state PV1 during the program operation is described with reference to FIGS. 3 and 4.

Referring to FIG. 3, a threshold voltage distribution of the memory cells to be programmed to the first program state PV1 during the program operation is shown. Meanwhile, FIG. 3 shows the main verify voltage Vvf1, the first auxiliary verify voltage Vvf1', and the second auxiliary verify voltage Vvf1" corresponding to the first program state PV1. The memory cells to be programmed to the first program state PV1 may be divided into four groups A to D by the main verify voltage Vvf1, the first auxiliary verify voltage Vvf1', and the second auxiliary verify voltage Vvf1". That is, the memory cells D having a threshold voltage greater than the main verify voltage Vvf1 are programmed to the first program state PV1. Accordingly, as shown in FIG. 4, in a subsequent program loop, a program inhibit voltage Vinh may be applied to a bit line $BL_D$ connected to the memory cells D having a threshold voltage higher than a main verify voltage Vvf1. In an embodiment, the program inhibit voltage may be a power voltage. On the other hand, the memory cells A, B, and C having a threshold voltage less than the main verify voltage Vvf1 are not yet programmed to the first program state PV1. Accordingly, in a subsequent program loop, a program allowable voltage less than the program inhibit voltage may be applied to bit lines $BL_A$, $BL_B$, and $BL_C$ connected to the memory cells A, B, and C having a threshold voltage less than the main verify voltage Vvf1.

Meanwhile, a program speed of the memory cells that are not yet programmed to the first program state PV1 may be adjusted using the first auxiliary verify voltage Vvf1' and the second auxiliary verify voltage Vvf1". That is, a threshold voltage distribution width of the first program state PV1 may be narrowed by decreasing a threshold voltage movement width of memory cells near the main verify voltage Vvf1.

More specifically, a ground voltage VSS may be applied to the bit line $BL_A$ connected to the memory cells A having the threshold voltage less than the second auxiliary verify voltage Vvf1" among the memory cells to be programmed to the first program state PV1. Meanwhile, a first program allowable voltage VREF1 is applied to the bit line $BL_B$ connected to the memory cells B having the threshold voltage greater than the second auxiliary verify voltage Vvf1" and less than the first auxiliary verify voltage Vvf1' among the memory cells to be programmed to the first program state PV1. In an embodiment, the first program allowable voltage VREF1 may be a voltage greater than the ground voltage VSS and less than the program inhibit voltage Vinh. In addition, a second program allowable voltage VREF2 is applied to the bit line $BL_C$ connected to the memory cells C having the threshold voltage greater than the first auxiliary verify voltage Vvf1' and less than the main verify voltage Vvf1 among the memory cells to be programmed to the first program state PV1. In an embodiment, the second program allowable voltage VREF2 may be a voltage greater than the first program allowable voltage VREF1 and less than the program inhibit voltage Vinh.

While the program voltage is applied to the selected word line, the threshold voltage of the memory cells connected to the bit line to which the program inhibit voltage is applied is maintained. Meanwhile, while the program voltage is applied to the selected word line, a threshold voltage movement width of the memory cells C connected to the bit line $BL_C$ to which the second program allowable voltage VREF2 is applied is less than a threshold voltage movement width of the memory cells B connected to the bit line $BL_B$ to which the first program allowable voltage VREF1 is applied. In addition, while the program voltage is applied to the selected word line, the threshold voltage movement width of the memory cells B connected to the bit line $BL_B$ to which the first program allowable voltage VREF1 is applied is less than a threshold voltage movement width of the memory cells A connected to the bit line $BL_A$ to which the ground voltage VSS is applied.

Accordingly, the threshold voltage distribution width of the memory cells programmed to the first program state PV1 may be narrowed by controlling the threshold voltage movement width of the memory cells A, B, and C in which program is not completed for each section.

Although the first program state PV1 is described above as an example, a program operation for the second and third program states PV2 and PV3 may also be performed by the same method.

Hereinafter, for convenience of discussion, a semiconductor memory device and a method of operating the same according to the present disclosure are described based on a program operation for the MLC. However, the present disclosure is not limited thereto, and is applicable to program of a single-level cell (SLC), a triple-level cell (TLC), and the like.

Figure 5:
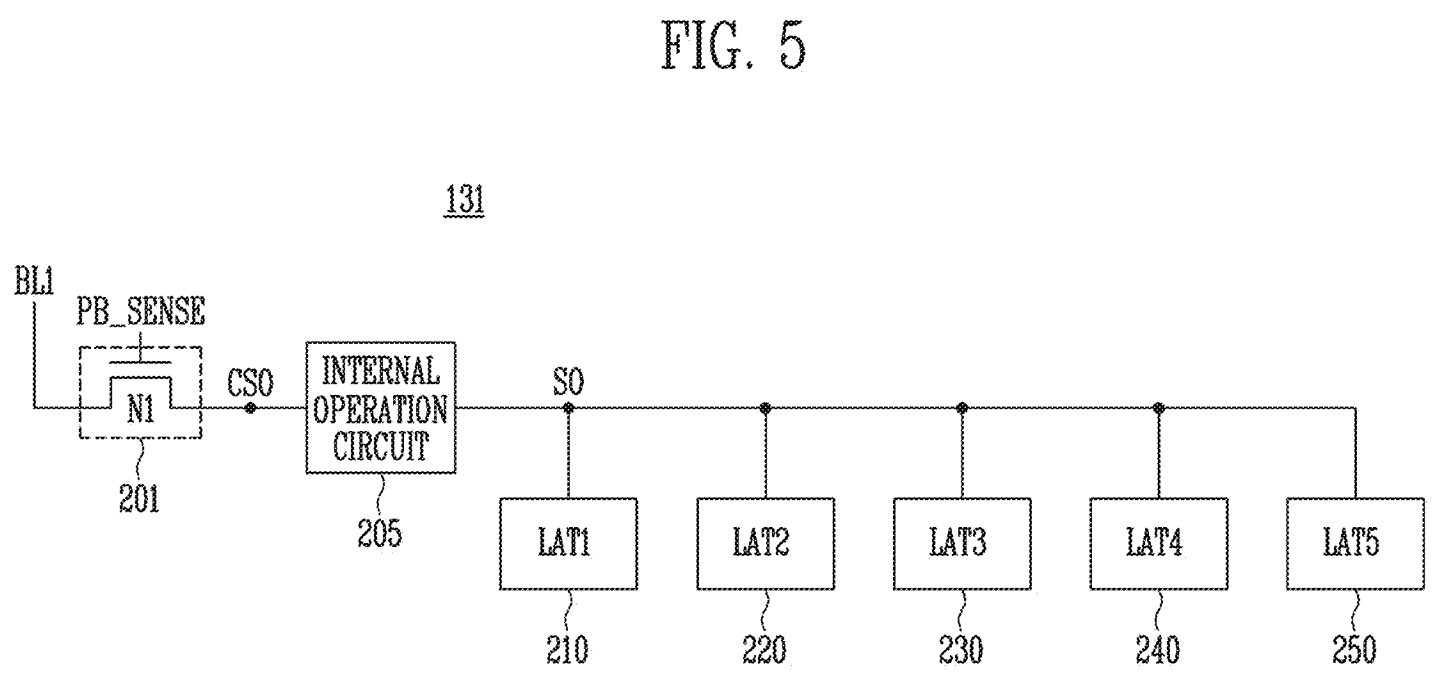

FIG. 5 is a block diagram illustrating a page buffer according to an embodiment of the present disclosure. FIG. 5 shows a block diagram of the page buffer 131 connected to the first bit line BL1 in FIG. 1 as an example.

Referring to FIG. 5, the page buffer 131 may include a bit line connection transistor 201, an internal operation circuit 205, and a plurality of latch circuits 210, 220, 230, 240, and 250. For example, the page buffer 131 shown in FIG. 5 may include a first latch circuit (LAT1) 210, a second latch circuit (LAT2) 220, a third latch circuit (LAT3) 230, a fourth latch circuit (LAT4) 240, and a fifth latch circuit (LAT5) 250. However, this is merely an example, and the number of latch circuits included in the page buffer 131 may vary as needed.

The bit line connection transistor 201 is connected between the first bit line BL1 and the internal operation circuit 205. Specifically, the bit line connection transistor 201 is connected to the internal operation circuit 205 through a node CSO. The bit line connection transistor 201 may be controlled by a control signal PB_SENSE and control a connection between the first bit line BL1 and the internal operation circuit 205. In an embodiment, the bit line connection transistor 201 may be implemented as a first NMOS transistor N1. When the first NMOS transistor N1 is turned on, the first bit line BL1 may be connected to the internal operation circuit 205 through the node CSO. The signal—PB_SENSE—may be output from the control logic 140 and input to the bit line connection transistor 201.

Meanwhile, the latch circuits 210, 220, 230, 240, and 250 are connected to the internal operation circuit 205 through a node SO. Bit data received from an outside may be stored in at least a portion of the latch circuits 210, 220, 230, 240, and 250 for the program operation. For example, the page buffer 131 may include latch circuits for storing two bits for programming the MLC. For example, among the latch circuits 210, 220, 230, 240, and 250, the LSB may be stored in the fourth latch circuit 240, and the MSB may be stored in the fifth latch circuit 250.

For example, in a case where data bits indicating a logic value of "1" are stored in the fourth and fifth latch circuits 240 and 250, respectively, the case means that a threshold voltage of a memory cell connected to a corresponding page buffer is required to maintain the erase state E.

As another example, in a case where a data bit indicating the logic value of "0" is stored in the fourth latch circuit 240 and a data bit indicating a logic value of "1" is stored in the fifth latch circuit 250, the case means that the memory cell connected to the corresponding page buffer is the memory cell to be programmed to the first program state PV1.

As still another example, in a case where data bits indicating the logic value of "0" are stored in the fourth and fifth latch circuits 240 and 250, respectively, the case means that the memory cell connected to the corresponding page buffer is a memory cell to be programmed to the second program state PV2.

As further still another example, in a case where the data bit indicating the logic value of "1" is stored in the fourth latch circuit 240 and the data bit indicating the logic value of "0" is stored in the fifth latch circuit 250, the case means that the memory cell connected to the corresponding page buffer is a memory cell to be programmed to the third program state PV3.

However, this is an example, and the page buffer 131 may include latch circuits for storing three bits for programming the TLC. In this case, the page buffer 131 may further include a sixth latch circuit for storing a central significant bit CSB in addition to the fourth and fifth latch circuits for storing the LSB and the MSB.

Hereinafter, a case where the data bit indicating the logic value of "0" is stored in the fourth latch circuit 240 and the data bit indicating the logic value of "1" is stored in the fifth latch circuit 250, that is, a case where the target program state of the memory cell connected to the first bit line BL1 is the first program state PV1 is described as an example.

As described above with reference to FIGS. 2 and 3, the page buffer 131 may include three latch circuits to store bits indicating whether each of the threshold voltages of each memory cell is greater than the main verify voltage, the first auxiliary verify voltage, and the second auxiliary verify voltage, during the program process. When the target program state of the memory cell connected to the first bit line BL1 is the first program state PV1, a bit indicating whether the threshold voltage of the corresponding memory cell is greater than the main verify voltage Vvf1 may be stored in the first latch circuit 210. For example, when the threshold voltage of the memory cell is greater than the main verify voltage Vvf1, the data bit having the logic value of "0" may be stored in the first latch circuit 210, and when the threshold voltage of the memory cell is less than the main verify voltage Vvf1, the data bit having the logic value of "1" may be stored in the first latch circuit 210.

In addition, a bit indicating whether the threshold voltage of the memory cell is greater than the first auxiliary verify voltage Vvf1' may be stored in the second latch circuit 220. For example, when the threshold voltage of the memory cell is greater than the first auxiliary verify voltage Vvf1', the data bit having the logic value of "0" may be stored in the second latch circuit 220, and when the threshold voltage of the memory cell is less than the first auxiliary verify voltage Vvf1', the data bit having the logic value of "1" may be stored in the second latch circuit 220.

Meanwhile, a bit indicating whether the threshold voltage of the memory cell is greater than the second auxiliary verify voltage Vvf1" may be stored in the third latch circuit 230. For example, when the threshold voltage of the memory cell is greater than the second auxiliary verify voltage Vvf1", the data bit having the logic value of "0" may be stored in the third latch circuit 230, and when the threshold voltage of the memory cell is less than the second auxiliary verify voltage Vvf1", the data bit having the logic value of "1" may be stored in the third latch circuit 230.

Summarizing the above, in the page buffer connected to the memory cells of the group A shown in FIG. 3, data bits of "1", "1", and "1" may be stored in the first to third latch circuits 210, 220, and 230, respectively. In addition, in the page buffer connected to the memory cells of the group B, data bits of "1", "1", and "0" may be stored in the first to third latch circuits 210, 220, and 230, respectively. Meanwhile, in the page buffer connected to the memory cells of the group C, data bits of "1", "0", and "0" may be stored in the first to third latch circuits 210, 220, and 230, respectively. Finally, in the page buffer connected to the memory cells of the group D, data bits of "0", "0", and "0" may be stored in the first to third latch circuits 210, 220, and 230, respectively. The page buffer 131 may set a voltage of bit lines to be applied to a subsequent program loop as shown in FIG. 4, based on the data bits stored in the first to third latch circuits 210, 220, and 230.

The internal operation circuit 205 and the first to fifth latch circuits 210, 220, 230, 240, and 250 may be designed in various methods as needed. Example embodiments of the internal operation circuit 205 and the first to fifth latch circuits 210, 220, 230, 240, and 250 are described with reference to FIGS. 6 and 11.

Figure 6:
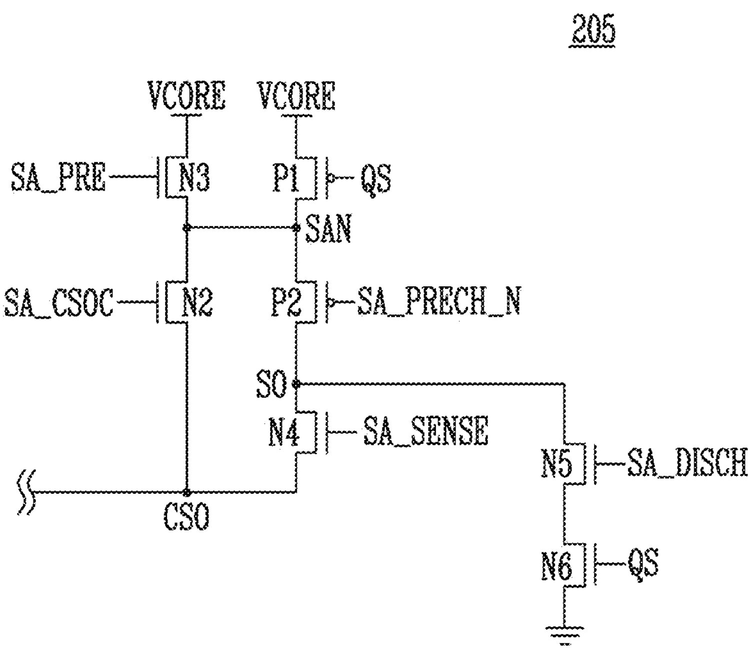
FIG. 6 is an example circuit diagram of an internal operation circuit shown in FIG. 5.

FIG. 6 is an example circuit diagram of the internal operation circuit 205 shown in FIG. 5.

The internal operation circuit 205 may operate in response to signals output from the control logic 140. Signals SA_PRE, SA_CSOC, SA_PRECH_N, SA_SENSE, and SA_DISCH described below may be signals output from the control logic 140. A detailed description of the internal operation circuit 205 is as follows.

Referring to FIG. 6, the internal operation circuit 205 may include second to sixth NMOS transistors N2 to N6 and first and second PMOS transistors P1 and P2. The second NMOS transistor N2 is connected between the node CSO and a node SAN, and is controlled by the signal SA_CSOC. The third NMOS transistor N3 is connected between a power voltage VCORE and the node SAN, and is controlled by the signal SA_PRE. The first PMOS transistor P1 is connected between the power voltage VCORE and the node SAN, and is controlled by a voltage of a node QS. The node QS is described with reference to FIG. 7.

The second PMOS transistor P2 is connected between the node SAN and the node SO, and is controlled by the signal SA_PRECH_N. The fourth NMOS transistor N4 is connected between the node SO and the node CSO, and is controlled by the signal SA_SENSE.

The fifth NMOS transistor N5 and the sixth NMOS transistor N6 are connected in series between the node SO and a ground voltage. The fifth NMOS transistor N5 is controlled by the signal SA_DISCH, and the sixth NMOS transistor N6 is controlled by a voltage of the node QS.

As described above with reference to FIG. 5, the first NMOS transistor N1 may be connected between the node CSO and the first bit line BL1.

Figure 7:
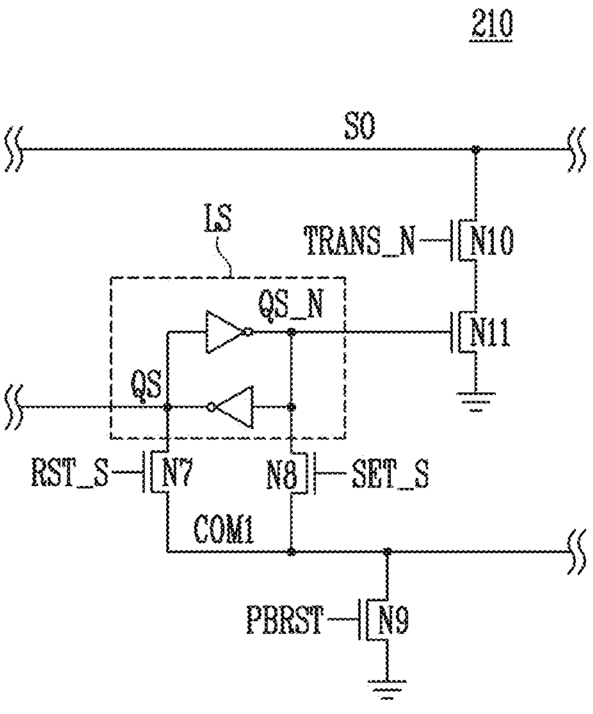
FIG. 7 is an example circuit diagram of a first latch circuit shown in FIG. 5.

FIG. 7 is an example circuit diagram of the first latch circuit 210 shown in FIG. 5.

Referring to FIG. 7, the first latch circuit 210 may include a latch LS connected between nodes QS and QS_N, a seventh NMOS transistor N7 connected between the node QS and a node COM1, an eighth NMOS transistor N8 connected between the node QS_N and the node COM1, a ninth NMOS transistor N9 connected between the node COM1 and the ground voltage, and a tenth NMOS transistor N10 and an eleventh NMOS transistor N11 connected in series between the node SO and the ground voltage.

The seventh NMOS transistor N7, the eighth NMOS transistor N8, the ninth NMOS transistor N9, and the tenth NMOS transistor N10 may be controlled by signals RST_S, SET_S, PBRST, and TRANS_N, respectively. In addition, the eleventh NMOS transistor N11 may be controlled by a voltage value of the node QS_N.

A voltage value of the node QS of the latch LS and a voltage value of the node QS_N may be logic-inverted values. That is, when the voltage value of the node QS is a logic-high voltage value, the voltage value of the node QS_N becomes a logic-low voltage value. Conversely, when the voltage value of the node QS is a logic-low voltage value, the voltage value of the node QS_N becomes a logic-high voltage value. A bit stored in the first latch circuit 210 may be expressed by the voltage value of the node QS or the node QS_N.

In an embodiment, it may be determined that the first latch circuit 210 stores the value of "0" when the voltage value of the node QS is the logic-high voltage value and the voltage value of the node QS_N is the logic-low voltage value and the first latch circuit 210 stores the value of "1" when the voltage value of the node QS is the logic-low voltage value and the voltage value of the node QS_N is the logic-high voltage value.

Conversely, it may be determined that the first latch circuit 210 may stores the value of "1" when the voltage value of the node QS is the logic-high voltage value and the voltage value of the node QS_N is the logic-low voltage value and the first latch circuit 210 stores the value of "0" when the voltage value of the node QS is the logic-low voltage value and the voltage value of the node QS_N is the logic-high voltage value.

For convenience of discussion, in the present specification, the present disclosure is described based on an embodiment in which the first latch circuit 210 stores the value of "1" when the voltage value of the node QS is the logic-high voltage value and the voltage value of the node QS_N is the logic-low voltage value and the first latch circuit 210 stores the value of "0" when the voltage value of the node QS is the logic-low voltage value and the voltage value of the node QS_N is the logic-high voltage value.

Figure 8:
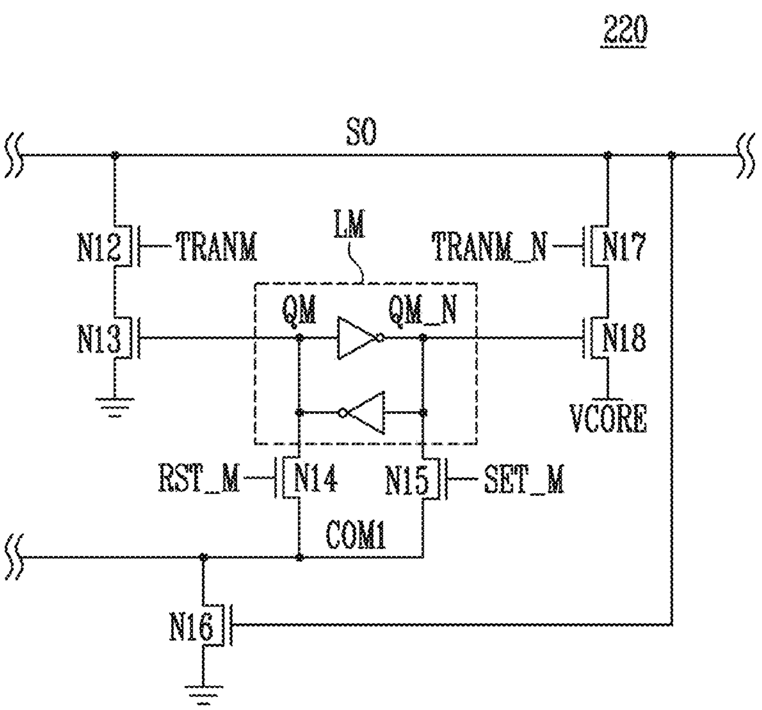
FIG. 8 is an example circuit diagram of a second latch circuit shown in FIG. 5.

FIG. 8 is an example circuit diagram of the second latch circuit 220 shown in FIG. 5.

Referring to FIG. 8, the second latch circuit 220 may include twelfth and thirteenth NMOS transistors N12 and N13 connected in series between the node SO and the ground voltage, a latch LM connected between nodes QM and QM_N, a fourteenth NMOS transistor N14 connected between the node QM and the node COM1, and a fifteenth NMOS transistor N15 connected between the node QS_N and the node COM1, a sixteenth NMOS transistor N16 connected between the node COM1 and the ground voltage, and a seventeenth NMOS transistor N17 and an eighteenth NMOS transistor N18 connected in series between the node SO and the power voltage.

The twelfth NMOS transistor N12, the fourteenth NMOS transistor N14, the fifteenth NMOS transistor N15, and the seventeenth NMOS transistor N17 may be controlled by signals TRNM, RST_M, SET_M, and TRANM_N, respectively. The thirteenth NMOS transistor N13 may be controlled by a voltage value of the node QM, the sixteenth NMOS transistor N16 may be controlled by a voltage value of the node SO, and the eighteenth NMOS transistor N18 may be controlled by a voltage value of the node QM_N.

For convenience of discussion, in the present specification, the present disclosure is described based on an embodiment in which the second latch circuit 220 stores the value of "1" when the voltage value of the node QM is the logic-high voltage value and the voltage value of the node QM_N is the logic-low voltage value and the second latch circuit 220 stores the value of "0" when the voltage value of the node QM is the logic-low voltage value and the voltage value of the node QM_N is the logic-high voltage value.

Figure 9:
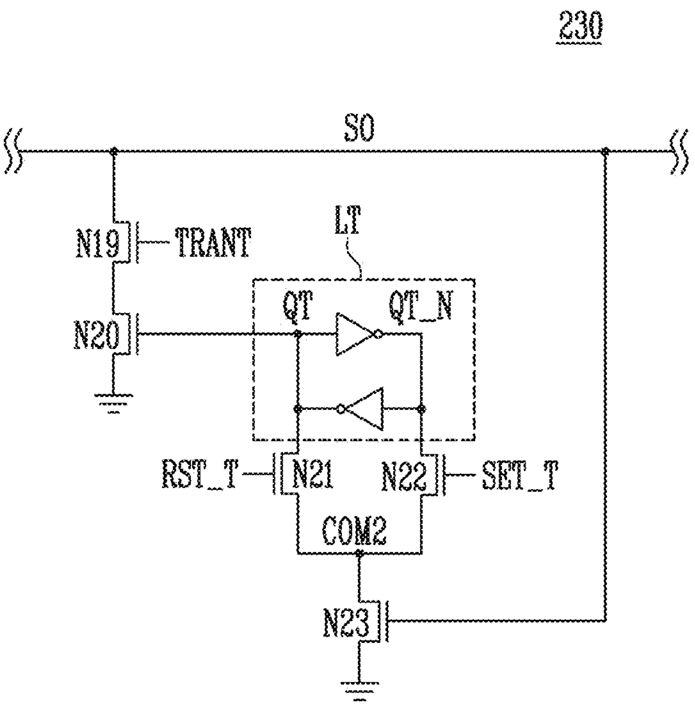
FIG. 9 is an example circuit diagram of a third latch circuit shown in FIG. 5.

FIG. 9 is an example circuit diagram of the third latch circuit 230 shown in FIG. 5.

Referring to FIG. 9, the third latch circuit 230 may include nineteenth and twentieth NMOS transistors N19 and N20 connected in series between the node SO and the ground voltage, a latch LT connected between nodes QT and QT_N, a twenty-first NMOS transistor N21 connected between the node QT and the node COM2, a twenty-second NMOS transistor N22 connected between the node QT_N and the node COM2, a twenty-third NMOS transistor N23 connected between the node COM2 and the ground voltage.

The nineteenth NMOS transistor N19, the twenty-first NMOS transistor N21, and the twenty-second NMOS transistor N22 may be controlled by signals TRANT, RST_T, and SET_T, respectively. The twentieth NMOS transistor N20 may be controlled by a voltage value of the node QT, and the twenty-third NMOS transistor N23 may be controlled by the voltage value of the node SO.

For convenience of discussion, in the present specification, the present disclosure is described based on an embodiment in which the third latch circuit 230 stores the value of "1" when the voltage value of the node QT is the logic-high voltage value and the voltage value of the node QT_N is the logic-low voltage value and the third latch circuit 230 stores the value of "0" when the voltage value of the node QT is the logic-low voltage value and the voltage value of the node QT_N is the logic-high voltage value.

Figure 10:
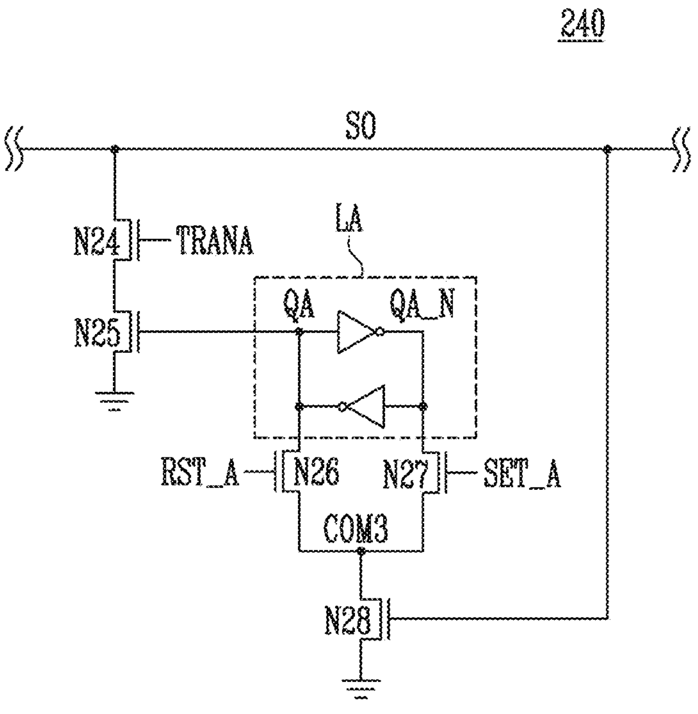
FIG. 10 is an example circuit diagram of a fourth latch circuit shown in FIG. 5.

FIG. 10 is an example circuit diagram of the fourth latch circuit 240 shown in FIG. 5.

Referring to FIG. 10, the fourth latch circuit 240 may include twenty-forth and twenty-fifth NMOS transistors N24 and N25 connected in series between the node SO and the ground voltage, a latch LA connected between nodes QA and QA_N, a twenty-sixth NMOS transistor N26 connected between the node QA and a node COM3, a twenty-seventh NMOS transistor N27 connected between the node QA_N and the node COM3, and a twenty-eighth NMOS transistor N28 connected between the node COM3 and the ground voltage.

The twenty-forth NMOS transistor N24, the twenty-sixth NMOS transistor N26, and twenty-seventh NMOS transistor N27 may be controlled by the signals TRANA, RST_A, and SET_A, respectively. The twenty-fifth NMOS transistor N25 may be controlled by a voltage value of the node QA, and the twenty-eighth NMOS transistor N28 may be controlled by the voltage value of the node SO.

For convenience of discussion, in the present specification, the present disclosure is described based on an embodiment in which the fourth latch circuit 240 stores the value of "1" when the voltage value of the node QA is the logic-high voltage value and the voltage value of the node QA_N is the logic-low voltage value and the fourth latch circuit 240 stores the value of "0" when the voltage value of the node QA is the logic-low voltage value and the voltage value of the node QA_N is the logic-high voltage value.

Figure 11:
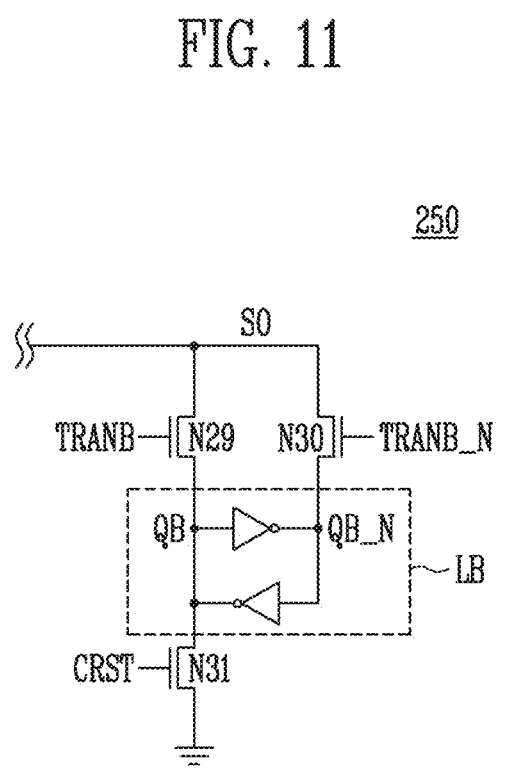

FIG. 11 is an example circuit diagram of the fifth latch circuit 250 shown in FIG. 5.

Referring to FIG. 11, the fifth latch circuit 250 may include a latch LB connected between nodes QB and QB_N, a twenty-ninth NMOS transistor N29 connected between the node SO and a node QB, a thirtieth NMOS transistor N30 connected between the node SO and the node QB_N, a thirty-first NMOS transistor N31 connected between the node QB and the ground voltage. The twenty-ninth NMOS transistor N29, the thirtieth NMOS transistor N30, and the thirty-first NMOS transistor N31 may be controlled by signals TRANB, TRANSB_N, and CRST, respectively.

For convenience of discussion, in the present specification, the present disclosure is described based on an embodiment in which the fifth latch circuit 250 stores the value of "1" when a voltage value of the node QB is the logic-high voltage value and a voltage value of the node QB_N is the logic-low voltage value and the fifth latch circuit 250 stores the value of "0" when the voltage value of the node QB is the logic-low voltage value and the voltage value of the node QB_N is the logic-high voltage value.

Figure 12:
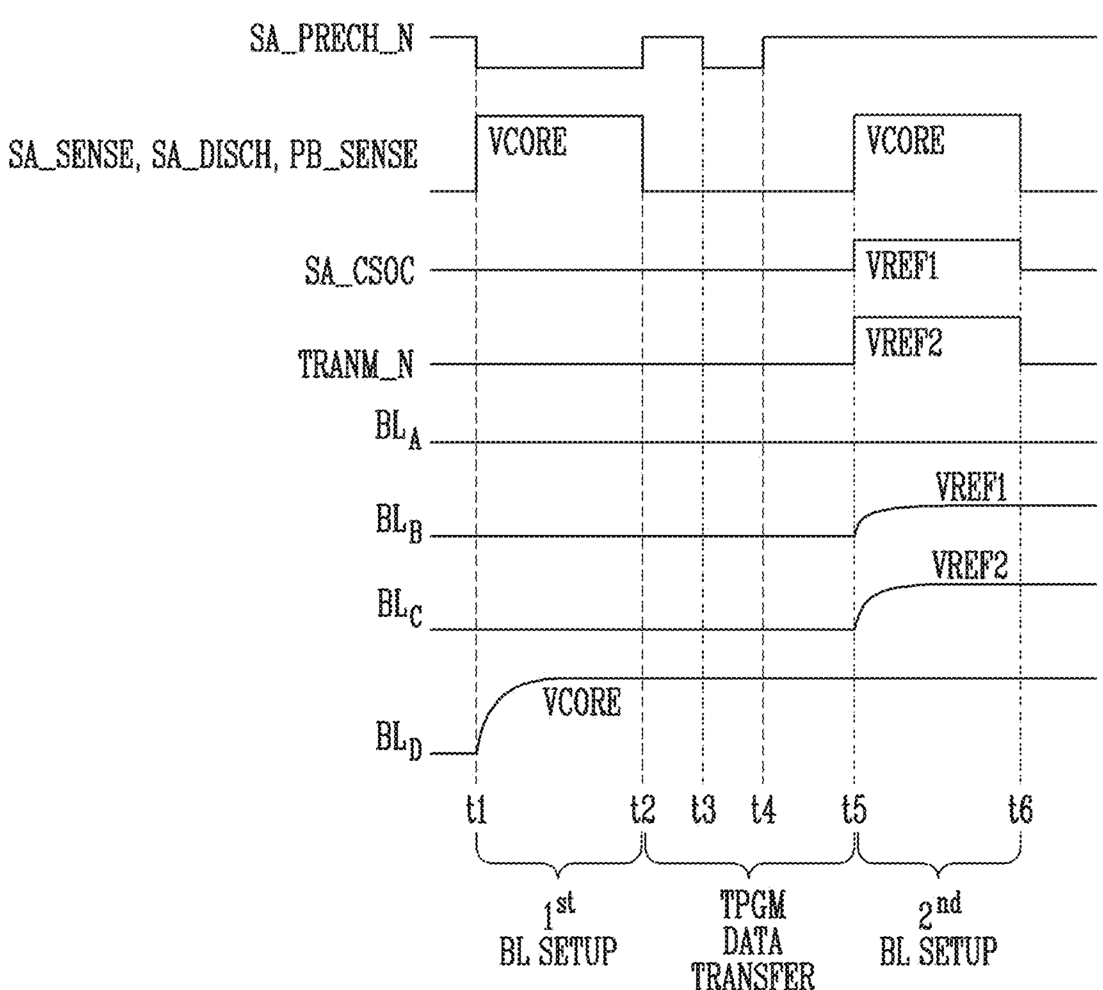
FIG. 12 is a timing diagram illustrating operation of a semiconductor memory device according to an embodiment of the present disclosure.

FIG. 12 is a timing diagram illustrating operation of a semiconductor memory device according to an embodiment of the present disclosure.

Referring to FIG. 12, a timing diagram for setting a bit line voltage immediately before the program voltage is applied to the selected word line during the program operation of the semiconductor memory device is shown. Prior to a time t1 shown in FIG. 12, data bits indicating a verification result using the main verify voltage Vvf1, the first auxiliary verify voltage Vvf1', and the second auxiliary verify voltage Vvf1" may be stored in the first to third latch circuits 210, 220, and 230 of the page buffer 131.

A first bit line setting operation is performed from the time t1 to a time t2. Specifically, the signal SA_PRECH_N is activated to a low voltage at the time t1. Accordingly, the second PMOS transistor P2 is turned on at the time t1.

Meanwhile, the signals SA_SENSE, SA_DISCH, and PB_SENSE are activated to a high voltage at the time t1. Accordingly, the fourth NMOS transistor N4, the fifth NMOS transistor N5, and the first NMOS transistor N1 are turned on at the time t1.

Referring to the first NMOS transistor N1 of FIG. 5 and the internal operation circuit 205 of FIG. 6 together, because the second PMOS transistor P2, the fourth NMOS transistor N4, and the fifth NMOS transistor N5 are turned on at the time t1, a voltage of the bit line may be set differently according to data stored in the first latch circuit 210.

More specifically, when the threshold voltage of the memory cell is greater than the main verify voltage Vvf1, the data bit having the logic value of "0" may be stored in the first latch circuit 210. In this case, the voltage value of the node QS may be the logic-low voltage value. Accordingly, the first PMOS transistor P1 is turned on and the sixth NMOS transistor N6 is turned off. Accordingly, the bit line is connected to the power voltage through a path including the first PMOS transistor P1, the second PMOS transistor P2, the fourth NMOS transistor N4, and the first NMOS transistor N1. That is, a voltage of the bit line $BL_D$ connected to the memory cells of the group D starts to increase to the power voltage VCORE at the time t1.

Meanwhile, when the threshold voltage of the memory cell is less than the main verify voltage Vvf1, the data bit having the logic value of "1" may be stored in the first latch circuit 210. In this case, the voltage value of the node QS may be the logic-high voltage value. Accordingly, the first PMOS transistor P1 is turned off and the sixth NMOS transistor N6 is turned on. Accordingly, the bit line is connected to the ground voltage through a path including the sixth NMOS transistor N6, the fifth NMOS transistor N5, the fourth NMOS transistor N4, and the first NMOS transistor N1. That is, a voltage of the bit lines $BL_A$, $BL_B$, and $BL_C$ connected to the memory cells of the groups A to C might not increase at the time t1 and maintain the ground voltage.

Thereafter, TPGM data is moved from the time t2 to a time t5. The TPGM data is data indicating whether the threshold voltage of the memory cell is greater than the second auxiliary verify voltage Vvf1", and is data stored in the third latch circuit 230. During the period t2 to t5, the data stored in the third latch circuit 230 moves to the first latch circuit 210.

An operation of moving the data stored in the third latch circuit 230 to the first latch circuit 210 may be performed by transferring the voltage value of the node QT to the node QS. A step of transferring the voltage value of the node QT to the node QS is performed through the following process.

First, through initialization, the node QS has the high value indicating "1", that is, a power voltage value. This may be performed by turning on the eighth NMOS transistor N8 and the ninth NMOS transistor N9 through the signals PBRST and SET_S. In addition, through initialization, the node SO has the high value indicating "1", that is, the power voltage value. This may be performed by activating the signal SA_PRE to the high value to turn on the third NMOS transistor N3 and by activating the signal SA_PRECH_N to the low value to turn on the second PMOS transistor P2. In FIG. 12 the signal SA_PRECH_N is activated to the low value at a time t3.

In this state, when the signal TRANT applied to a gate of the nineteenth NMOS transistor N19 is activated to the high value, the nineteenth NMOS transistor N19 is turned on. In addition, the twentieth NMOS transistor N20 may be selectively turned on according to a value of the node QT to selectively change a value of the node SO.

For example, when the voltage value of the node QT is the high value, the twentieth NMOS transistor N20 is turned on, and thus a voltage of the node SO changes to the ground voltage. Conversely, when the voltage value of the node QT is the low value, the twentieth NMOS transistor N20 is turned off, and thus the voltage of the node SO maintains the high value.

Because the node SO is connected to a gate of the sixteenth NMOS transistor N16, the sixteenth NMOS transistor N16 is selectively turned on according to the voltage value of the node SO. Thereafter, the signal RST_S is activated to the high value to turn on the seventh NMOS transistor N7.

When the voltage of the node SO is the ground voltage, the sixteenth NMOS transistor N16 maintains a turn-off state. Accordingly, even though the seventh NMOS transistor N7 is turned on by activating the signal RST_S to the high value, the voltage of the node QS maintains the high value indicating "1".

Conversely, when the voltage of the node SO is high, the sixteenth NMOS transistor N16 is turned on. Accordingly, when the seventh NMOS transistor N7 is turned on by activating the signal RST_S to the high value, the node QS is electrically connected to the ground voltage, and thus changes to the low value indicating "0".

Through the above-described process, the data stored in the third latch circuit 230 may be transferred to the first latch circuit 210. FIG. 12 shows a portion of a process in which the node SO initializes the high value indicating "1" by activating the signal SA_PRECH_N to the low value at the time t3. Between a time t4 and the time t5, an operation of selectively changing the voltage value of the node SO according to the voltage value of the node QT to selectively change the voltage value of the node QS may be performed.

Thereafter, a second bit line setting operation is performed from the time t5 to a time t6. Specifically, the signals SA_SENSE, SA_DISCH, and PB_SENSE are activated to the high voltage at the time t5. Accordingly, the fourth NMOS transistor N4, the fifth NMOS transistor N5, and the first NMOS transistor N1 are turned on at the time t5.

Meanwhile, at the time t5, the signal SA_CSOC is activated to the first program allowable voltage VREF1. Accordingly, the second NMOS transistor N2 of the internal operation circuit 205 is turned on. In addition, through the TPGM data movement operation during the period t2 to t5, a verification result using the second auxiliary verify voltage Vvf1" is stored in the first latch circuit 210. When the threshold voltage of the memory cell is greater than the second auxiliary verify voltage Vvf1", the data bit having the logic value of "0" may be stored in the first latch circuit 210. In this case, because the voltage value of the node QS is the logic-low voltage value, the first PMOS transistor P1 is turned on. Accordingly, the voltage of the node CSO may start to increase at the time t5. However, because the first program allowable voltage VREF1, not the power voltage VCORE, is applied to a gate of the second NMOS transistor N2, a voltage of the node CSO may also increase to the first program allowable voltage VREF1. Because the first NMOS transistor N1 is turned on, the bit line voltage also increases to the first program allowable voltage VREF1. As a result, a voltage of the bit line $BL_B$ connected to the memory cells of the group B starts to increase to the first program allowable voltage VREF1 at the time t5.

Meanwhile, at the time t5, the signal TRANM_N is activated to the second program allowable voltage VREF2. Accordingly, the seventeenth NMOS transistor N17 of the second latch circuit 220 is turned on. As described above, a verification result using the first auxiliary verify voltage Vvf1' is stored in the second latch circuit 220. When the threshold voltage of the memory cell is greater than the first auxiliary verify voltage Vvf1', the data bit having the logic value of "0" may be stored in the second latch circuit 220. In this case, the voltage value of the node QM may be the logic-low voltage value, and the voltage value of the node QM_N may be the logic-high voltage value. Accordingly, the eighteenth NMOS transistor N18 is turned on. Accordingly, at the time t5, the voltage of node SO may start to increase. However, because the second program allowable voltage VREF2, not the power voltage VCORE, is applied to a gate of the seventh NMOS transistor N17, the voltage of the node SO may also increase to the second program allowable voltage VREF2. Because the fourth NMOS transistor N4 and the first NMOS transistor N1 are turned on, the bit line voltage also increases to the second program allowable voltage VREF2. As a result, a voltage of the bit line $BL_C$ connected to the memory cells of the group C starts to increase to the second program allowable voltage VREF2 at the time t5.

Through the above-described process, the voltages of the bit lines $BL_A$, $BL_B$, $BL_C$, and $BL_D$ connected to the memory cells belonging to the groups A to D may be respectively set. Meanwhile, after the time t6, the program pass voltage may be applied to the unselected word line and the program voltage may be applied to the selected word line in a state in which the respective bit line voltages are set. Accordingly, the threshold voltage of the memory cells included in the groups A to C may move, and the threshold voltage of the memory cells included in the group D may be maintained.

Specifically, because the voltage of the bit line $BL_D$ connected to the memory cells included in the group D is the power voltage corresponding to the program inhibit voltage, even though the program voltage is applied to the selected word line, the threshold voltage of the memory cells included in the group D might not increase.

Meanwhile, the voltage VREF1 of the bit line $BL_B$ connected to the memory cells included in the group B is greater than the voltage of the bit line $BL_A$ connected to the memory cells included in the group A, and the voltage VREF2 of the bit line $BL_C$ connected to the memory cells included in the group C is greater than the voltage VREF1 of the bit line $BL_B$ connected to the memory cells included in the group B. Therefore, the threshold voltage movement width of the memory cells included in the group A may be the greatest, the threshold voltage movement width of the memory cells included in the group B may be less than the threshold voltage movement width of the memory cells included in the group A, and the threshold voltage movement width of the memory cells included in the group C may be less than the threshold voltage movement width of the memory cells included in the group B.

Referring to the method of operating the semiconductor memory device shown in FIG. 12, during the first bit line setting period, the voltage of the bit line $BL_D$ connected to the memory cells belonging to the group D is set to the program inhibit voltage, and during the second bit line setting period, the voltage of the bit lines $BL_B$ and $BL_C$ connected to the memory cells belonging to the groups B and C are simultaneously set. In addition, during the second bit line setting period, the first program allowable voltage VREF1 is applied to the gate of the second NMOS transistor N2 in the internal operation circuit 205, and the second program allowable voltage VREF2 is applied to the seventeenth NMOS transistor N17 of the second latch circuit 220. According to the above-described method, the seventeenth and eighteenth NMOS transistors N17 and N18 are required to set the bit line $BL_C$ to the second program allowable voltage VREF2 according to DPGM data, that is, result data of the verify operation using the first auxiliary verify voltage Vvf1'. The number of page buffers may be equal to the number m of bit lines BL1 to BLm connected to the memory block. Accordingly, a total of 2 m NMOS transistors are required to include the seventeenth and eighteenth NMOS transistors N17 and N18 for each page buffer. As the number m of the bit lines BL1 to BLm connected to one memory block increases, the total number of NMOS transistors additionally required to set the bit line $BL_C$ to the second program allowable voltage VREF2 also increases.

According to a method of operating a semiconductor memory device according to another embodiment of the present disclosure, the voltages of the bit line $BL_D$ connected to the memory cells belonging to the group D, the bit line $BL_C$ connected to the memory cells belonging to the group C, and the bit line $BL_B$ connected to the memory cells belonging to the group B are sequentially set. In addition, according to the method of operating the semiconductor memory device according to another embodiment of the present disclosure, when the voltage of the bit line $BL_B$ connected to the memory cells belonging to the group B is set, the first program allowable voltage VREF1 is applied to a gate of the bit line connection transistor 201, and when the voltage of the bit line $BL_C$ connected to the memory cells belonging to the group C is set, the second program allowable voltage VREF2 greater than the first program allowable voltage VREF1 is applied to the gate of the bit line connection transistor 201. Accordingly, the bit line $BL_C$ may be set to the second program allowable voltage VREF2 according to the DPGM data, that is, the result data of the verify operation using the first auxiliary verify voltage Vvf1', without the seventeenth and eighteenth NMOS transistors N17 and N18 of the second latch circuit 220. Hereinafter, the disclosure is described with reference to FIG. 13.

Figure 13:
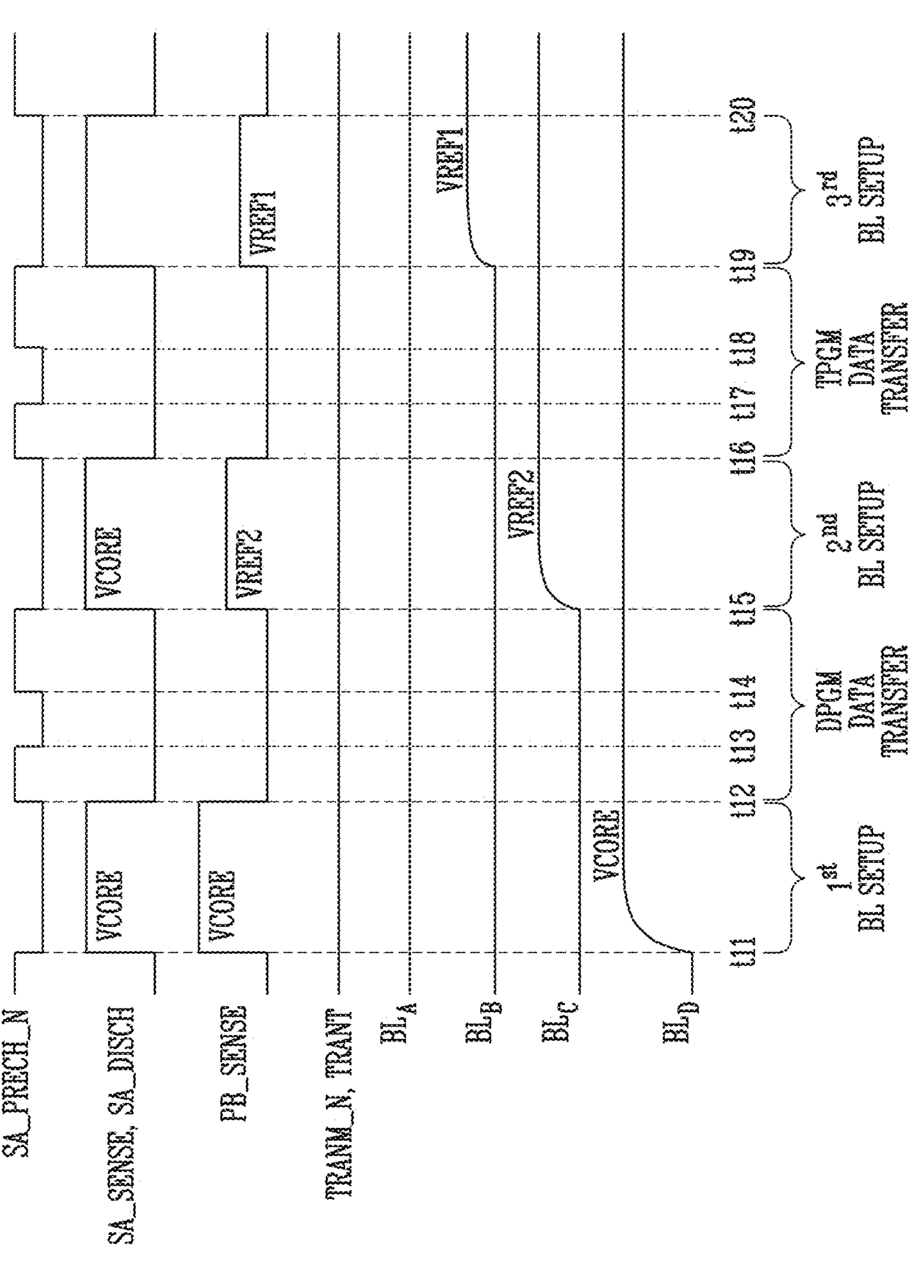
FIG. 13 is a timing diagram illustrating operation of a semiconductor memory device according to another embodiment of the present disclosure.

FIG. 13 is a timing diagram illustrating operation of a semiconductor memory device according to another embodiment of the present disclosure. Hereinafter, content similar to or overlapping content described with reference to FIG. 12 is omitted.

Referring to FIG. 13, another timing diagram for setting the bit line voltage immediately before the program voltage is applied to the selected word line during the program operation of the semiconductor memory device is shown. Prior to a time t11 shown in FIG. 13, data bits indicating the verification result using the main verify voltage Vvf1, the first auxiliary verify voltage Vvf1', and the second auxiliary verify voltage Vvf1" may be stored in the first to third latch circuits 210, 220, and 230 of the page buffer 131.

The first bit line setting operation is performed from the time t11 to a time t12. Because the first bit line setting operation performed during the period t11 to t12 may be performed substantially the same as the first bit line setting operation performed during the period t1 to t2 of FIG. 12, an overlapping description is omitted. Through the first bit line setting operation, the voltage of the bit line $BL_D$ connected to the memory cells of the group D starts to increase to the power voltage VCORE at the time t11. On the other hand, the voltages of the bit lines $BL_A$, $BL_B$, and $BL_C$ connected to the memory cells of the groups A to C might not increase at the time t11 and maintain the ground voltage.

Thereafter, the DPGM data is moved during a period t12 to t15. The DPGM data is data indicating whether the threshold voltage of the memory cell is greater than the first auxiliary verify voltage Vvf1', and is data stored in the second latch circuit 220. During the period t12 to t15, the data stored in the second latch circuit 220 moves to the first latch circuit 210. A method of moving the data stored in the second latch circuit 220 to the first latch circuit 210 may be performed by substantially the same method as the method of moving the data stored in the third latch circuit 230 to the first latch circuit 210. Because the method of moving the data stored in the third latch circuit 230 to the first latch circuit 210 is described above with reference to FIG. 12, an overlapping description is omitted. FIG. 13 shows a portion of a process in which the node SO initializes the high value indicating "1" by activating the signal SA_PRECH_N to the low value at a time t13. Between a time t14 and a time t15, an operation of selectively changing the voltage value of the node SO according to the voltage value of the node QM and thus selectively changing the voltage value of the node QS may be performed.

The second bit line setting operation is performed from the time t15 to a time t16. During the period t15 to t16, the voltage of the bit line $BL_C$ connected to the memory cell of the group C is set based on the DPGM data stored in the first latch circuit 210.

Specifically, when the threshold voltage of the memory cell is greater than the first auxiliary verify voltage Vvf1', the DPGM data stored in the first latch circuit 210 may be the data bit having the logic value of "0". In this case, the voltage value of the node QS may be the logic-low voltage value. Accordingly, the first PMOS transistor P1 is turned on and the sixth NMOS transistor N6 is turned off. Accordingly, the bit line is connected to the power voltage through the path including the first PMOS transistor P1, the second PMOS transistor P2, the fourth NMOS transistor N4, and the first NMOS transistor N1. That is, the voltage of the bit line $BL_C$ connected to the memory cells of the group C starts to increase at the time t15. However, because the second program allowable voltage VREF2, not the power voltage VCORE, is applied to the gate of the bit line connection transistor, that is, the first NMOS transistor N1, the voltage of the bit line $BL_C$ may also increase to the second program allowable voltage VREF2.

Thereafter, the data stored in the third latch circuit 230 is moved to the first latch circuit 210 by the TPGM data movement operation performed during a period t16 to t19. Because the method of moving the data stored in the third latch circuit 230 to the first latch circuit 210 is described above with reference to FIG. 12, an overlapping description is omitted. FIG. 13 shows a portion of a process in which the node SO initializes the high value indicating "1" by activating the signal SA_PRECH_N to the low value at a time t17. Between a time t18 and a time t19, an operation of selectively changing the voltage value of the node SO according to the voltage value of the node QT and thus selectively changing the voltage value of the node QS may be performed.

Thereafter, a third bit line setting operation is performed from the time t19 to a time t20. During the period t19 to t20, the voltage of the bit line $BL_B$ connected to the memory cell of the group B is set based on the TPGM data stored in the first latch circuit 210.

Specifically, when the threshold voltage of the memory cell is greater than the second auxiliary verify voltage Vvf1", the TPGM data stored in the first latch circuit 210 may be the data bit having the logic value of "0". In this case, the voltage value of the node QS may be the logic-low voltage value. Accordingly, the first PMOS transistor P1 is turned on, and the sixth NMOS transistor N6 is turned off. Accordingly, the bit line is connected to the power voltage through the path including the first PMOS transistor P1, the second PMOS transistor P2, the fourth NMOS transistor N4, and the first NMOS transistor N1. That is, the voltage of the bit line $BL_B$ connected to the memory cells of the group B starts to increase at the time t19. However, because the first program allowable voltage VREF1, not the power voltage VCORE, is applied to the gate of the bit line connection transistor, that is, the first NMOS transistor N1, the voltage of the bit line $BL_B$ may also increase to the first program allowable voltage VREF1.

Through the above-described process, the voltages of the bit lines $BL_A$, $BL_B$, $BL_C$, and $BL_D$ connected to the memory cells belonging to the groups A to D may be respectively set. Meanwhile, after the time t20, the program pass voltage may be applied to the unselected word line and the program voltage may be applied to the selected word line in a state in which the respective bit line voltages are set. Accordingly, the threshold voltage of the memory cells included in the groups A to C may move, and the threshold voltage of the memory cells included in the group D may be maintained.

As described with reference to FIG. 13, according to the method of operating the semiconductor memory device according to another embodiment of the present disclosure, the voltages of the bit lines $BL_D$, $BL_C$, and $BL_B$ corresponding to the groups D, C, and B are sequentially set during three periods. In addition, when the voltage of the bit lines $BL_C$ and $BL_B$ corresponding to the groups C and B are set, the second program allowable voltage VREF2 or the first program allowable voltage VREF1 is applied to the gate of the bit line connection transistor 201. Accordingly, the semiconductor memory device according to another embodiment of the present disclosure does not require the seventeenth and eighteenth NMOS transistors N17 and N18 shown in FIG. 8. This is because the voltage of the bit lines $BL_C$ corresponding to the group C is set by applying the second program allowable voltage VREF2 to the gate of the bit line connection transistor 201 after moving the DPGM data to the first latch circuit 210 rather than applying the second program allowable voltage VREF2 to the gate of the seventeenth NMOS transistor N17 in a state in which the DPGM data is stored in the second latch circuit 220.

Figure 14:
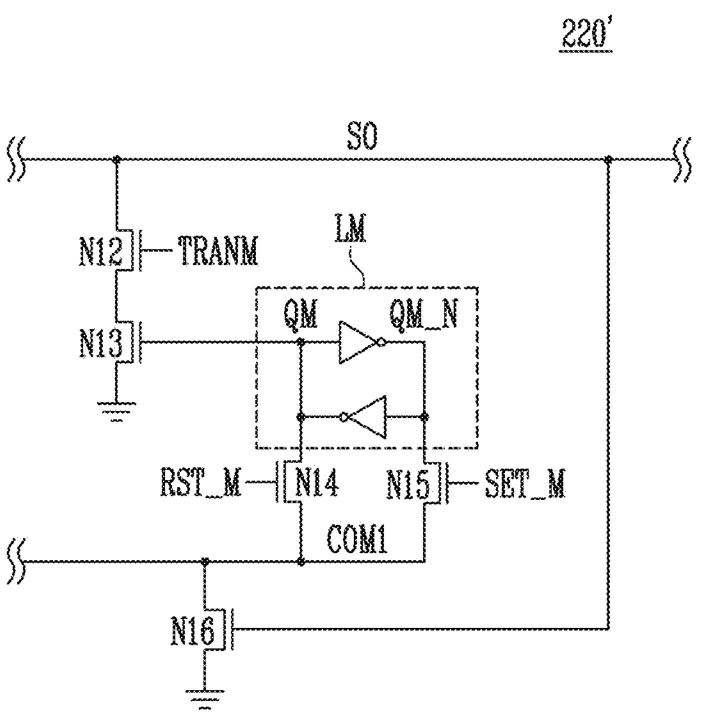
FIG. 14 is another example circuit diagram of the second latch circuit shown in FIG. 5.

FIG. 14 is another example circuit diagram of the second latch circuit shown in FIG. 5.

As described above, according to another embodiment of the present disclosure described through the timing diagram shown in FIG. 13, the second latch circuit 220' does not require the seventeenth and eighteenth NMOS transistors N17 and N18 shown in FIG. 8. Accordingly, the second latch circuit 220' may include only the twelfth and thirteenth NMOS transistors N12 and N13 connected in series between the node SO and the ground voltage, the latch LM connected between the nodes QM and QM_N, the fourteenth NMOS transistor N14 connected between the node QM and the node COM1, the fifteenth NMOS transistor N15 connected between the node QS_N and the node COM1, and the sixteenth NMOS transistor N16 connected between the node COM1 and the ground voltage. The second latch circuit 220' shown in FIG. 14 may have the same configuration as the second latch circuit 220 shown in FIG. 8 except that the seventeenth and eighteenth NMOS transistors N17 and N18 are not included.

The second latch circuit 220' shown in FIG. 14 does not include the seventeenth and eighteenth NMOS transistors N17 and N18 shown in FIG. 8. Therefore, when the number of page buffers is m, in a case where the second latch circuit 220' shown in FIG. 14 is used, the total number of 2m NMOS transistors may be reduced compared to a case where the second latch circuit 220 shown in FIG. 8 is used. Accordingly, a size of a chip required to manufacture the semiconductor memory device 100 may be reduced. As a result, a manufacturing cost of the semiconductor memory device may be reduced.

What is claimed is:

1. A semiconductor memory device comprising:

a memory cell array including a plurality of memory cells;

a plurality of page buffers respectively connected to the plurality of memory cells through bit lines; and control logic configured to control a program operation of each of the plurality of page buffers, wherein each of the plurality of page buffers comprises:

a bit line connection transistor connected to a corresponding bit line;

an internal operation circuit connected to the bit line connection transistor through a first node; and a plurality of latch circuits connected to the internal operation circuit through a second node, wherein during a program operation of selected memory cells among the plurality of memory cells, the control logic controls the plurality of page buffer to perform verify operations using a main verify voltage, a first auxiliary verify voltage, and a second auxiliary verify voltage corresponding to the target program state, wherein the plurality of latch circuits included in each of the plurality of page buffers comprises:

a first latch circuit configured to store first verify data indicating whether a threshold voltage of a corresponding memory cell is greater than the main verify voltage;

a second latch circuit configured to store second verify data indicating whether the threshold voltage of the memory cell is greater than the first auxiliary verify voltage; and a third latch circuit configured to store third verify data indicating whether the threshold voltage of the memory cell is greater than the second auxiliary verify voltage, wherein the control logic controls each of the page buffers to set a voltage of the bit line, according to at least one of the first verify data, the second verify data, and the third verify data, by sequentially applying a power voltage, a second program allowable voltage, and a first program allowable voltage to a gate of a corresponding bit line connection transistor, and wherein the second program allowable voltage is less than the power voltage, and the first program allowable voltage is less than the second program allowable voltage.

2. The semiconductor memory device of claim 1, wherein the semiconductor memory device is configured so that while the control logic applies the power voltage to the gate of the bit line connection transistor included in each of the plurality of page buffers, a voltage of the first node is selectively set to the power voltage or a ground voltage according to the first verify data stored in the first latch circuit.

3. The semiconductor memory device of claim 1, wherein the semiconductor memory device is configured so that after the voltage of the bit line connected to the memory cells having the threshold voltage greater than the main verify voltage is set to the program inhibit voltage, each of the page buffers moves the second verify data stored in the second latch circuit to the first latch circuit.

4. The semiconductor memory device of claim 3, wherein the semiconductor memory device is configured so that while the control logic applies the second program allowable voltage to the gate of the bit line connection transistor included in each of the plurality of page buffers, the voltage of the first node is selectively set to a power voltage or a ground voltage according to the second verify data stored in the first latch circuit.

5. The semiconductor memory device of claim 1, wherein the semiconductor memory device is configured so that after the voltage of the bit line connected to the memory cells having the threshold voltage greater than the first auxiliary verify voltage and less than the main verify voltage is set to the second program allowable voltage, each of the page buffers moves the third verify data stored in the third latch circuit to the first latch circuit.

6. The semiconductor memory device of claim 5, wherein the semiconductor memory device is configured so that while the control logic applies the first program allowable voltage to the gate of the bit line connection transistor included in each of the plurality of page buffers, the voltage of the first node is selectively set to a power voltage or a ground voltage according to the third verify data stored in the first latch circuit.

7. A semiconductor memory device comprising:

a memory cell configured to store N (N is a natural number greater than or equal to 2) bits;

a page buffer connected to the memory cell through a bit line; and control logic configured to control a program operation of the page buffer, wherein the page buffer comprises:

a bit line connection transistor connected to the bit line;

an internal operation circuit connected to the bit line connection transistor through a first node; and a plurality of latch circuits connected to the internal operation circuit through a second node, wherein the memory cell is programmed to a target program state among first to ($2^N$-1)-th program states, during a program operation of the memory cell, the control logic controls the page buffer to perform verify operations using a main verify voltage, a first auxiliary verify voltage, and a second auxiliary verify voltage corresponding to the target program state, respectively, and after the verify operations on the memory cell, the control logic controls the page buffer to set a voltage of the bit line according to a threshold voltage of the memory cell by sequentially applying a power voltage, a second program allowable voltage, and a first program allowable voltage to a gate of the bit line connection transistor, wherein the plurality of latch circuits comprises:

a first latch circuit configured to store first verify data indicating whether the threshold voltage of the memory cell is greater than the main verify voltage;

a second latch circuit configured to store second verify data indicating whether the threshold voltage of the memory cell is greater than the first auxiliary verify voltage; and a third latch circuit configured to store third verify data indicating whether the threshold voltage of the memory cell is greater than the second auxiliary verify voltage, and wherein the second program allowable voltage is less than the power voltage, and the first program allowable voltage is less than the second program allowable voltage.

8. The semiconductor memory device of claim 7, wherein the semiconductor memory device is configured so that when the threshold voltage of the memory cell is greater than the main verify voltage, the voltage of the bit line is set to the program inhibit voltage as the power voltage is applied to the gate of the bit line connection transistor.

9. The semiconductor memory device of claim 7, wherein the semiconductor memory device is configured so that when the threshold voltage of the memory cell is less than the main verify voltage and greater than the first auxiliary verify voltage, the voltage of the bit line is set to the second program allowable voltage as the second program allowable voltage is applied to the gate of the bit line connection transistor.

10. The semiconductor memory device of claim 7, wherein the semiconductor memory device is configured so that when the threshold voltage of the memory cell is less than the first auxiliary verify voltage and greater than the second auxiliary verify voltage, the voltage of the bit line is set to the first program allowable voltage as the first program allowable voltage is applied to the gate of the bit line connection transistor.

11. The semiconductor memory device of claim 7, wherein the voltage of the bit line is set to a ground voltage when the threshold voltage of the memory cell is less than the second auxiliary verify voltage.

12. The semiconductor memory device of claim 7, wherein the control logic controls the page buffer to move the second verify data which is stored in the second latch circuit to the first latch circuit after the power voltage is applied to the gate of the bit line connection transistor and before the second program allowable voltage is applied to the gate of the bit line connection transistor.

13. The semiconductor memory device of claim 7, wherein the control logic controls the page buffer to move the third verify data stored in the third latch circuit to the first latch circuit after the second program allowable voltage is applied to the gate of the bit line connection transistor and before the first program allowable voltage is applied to the gate of the bit line connection transistor.

14. The semiconductor memory device of claim 7, wherein the bit line connection transistor is a first NMOS transistor, and the internal operation circuit comprises:

a second NMOS transistor connected between the first node and a third node;

a third NMOS transistor connected between the power voltage and the third node;

a fourth NMOS transistor connected between the first node and the second node;

fifth and sixth NMOS transistors connected in series between the second node and a ground voltage;

a first PMOS transistor connected between the power voltage and the third node; and a second PMOS transistor connected between the second node and the third node.

15. The semiconductor memory device of claim 14, wherein the first latch circuit comprises:

a first latch connected between a fourth node and a fifth node having logic-inverted voltage values;

a seventh NMOS transistor connected between the fourth node and a sixth node;

an eighth NMOS transistor connected between the fifth node and the sixth node;

a ninth NMOS transistor connected between the sixth node and the ground voltage; and tenth and eleventh NMOS transistors connected in series between the second node and the ground voltage, wherein each of a gate of the first PMOS transistor and a gate of the sixth NMOS transistor is connected to the fourth node, and wherein a gate of the eleventh NMOS transistor is connected to the fifth node.

16. The semiconductor memory device of claim 15, wherein the second latch circuit comprises:

a second latch connected between a seventh node and an eighth node having logic-inverted voltage values;

twelfth and thirteenth NMOS transistors connected in series between the second node and the ground voltage;

a fourteenth NMOS transistor connected between the seventh node and the sixth node;

a fifteenth NMOS transistor connected between the eighth node and the sixth node; and a sixteenth NMOS transistor connected between the sixth node and the ground voltage, wherein a gate of the thirteenth NMOS transistor is connected to the seventh node, and wherein a gate of the sixteenth NMOS transistor is connected to the second node.

17. The semiconductor memory device of claim 16, wherein the third latch circuit comprises:

a third latch connected between a ninth node and a tenth node having logic-inverted voltage values;

seventeenth and eighteenth NMOS transistors connected in series between the second node and the ground voltage;

a nineteenth NMOS transistor connected between the ninth node and an eleventh node;

a twentieth NMOS transistor connected between the tenth node and the eleventh node; and a twenty-first NMOS transistor connected between the eleventh node and the ground voltage, wherein a gate of the eighteenth NMOS transistor is connected to the ninth node, and wherein a gate of the twenty-first NMOS transistor is connected to the second node.

* * * * *